United States Patent [19]

Adams et al.

[11] Patent Number: 4,645,551

[45] Date of Patent: Feb. 24, 1987

[54] METHOD OF MAKING AN OCTOCOUPLER

[75] Inventors: Victor J. Adams, Tempe; James R. Black; Horst A. Gempe, both of Phoenix, all of Ariz.

[73] Assignee: Motorola, Inc., Schaumburg, Ill.

[21] Appl. No.: 646,290

[22] Filed: Aug. 31, 1984

[51] Int. Cl.$^4$ .............................................. B32B 31/26
[52] U.S. Cl. ..................................... 156/82; 156/272.6; 156/273.3; 156/305; 156/308.2; 156/372; 357/19; 427/40
[58] Field of Search ............... 357/17, 19, 22; 156/82, 156/272.2, 272.6, 272.8, 273.3, 273.5, 275.1, 305, 308.2, 308.6, 322, 324.4, 308.8, 309.6, 314, 319, 329, 330; 427/39–41

[56] References Cited

U.S. PATENT DOCUMENTS

| | | | |
|---|---|---|---|
| 3,655,481 | 4/1972 | Hall | 156/273.3 |
| 4,223,074 | 9/1980 | Yoshida et al. | 156/273.5 |
| 4,271,365 | 6/1981 | Adams | 250/551 |
| 4,399,014 | 8/1983 | Engle | 156/643 |

Primary Examiner—Donald Czaja
Assistant Examiner—Merrell C. Cashion, Jr.
Attorney, Agent, or Firm—William E. Koch

[57] ABSTRACT

A process for bonding the surfaces of two polymeric materials and an improved optocoupler manufactured therewith is provided. Optocouplers are typically manufactured with the emitter and detector devices enclosed within a coupling material such as silicone gel for providing an electrical dielectric while being transparent to light. The coupling material is enclosed within an encapsulating material that is both reflective to light, protective against mechanical forces, and opaque to ambient light. The disclosed process bonds the coupling material to the encapsulating material to eliminate creepage paths and prevent the resultant voltage breakdown between electrodes along the interface of the two materials. The coupling material is treated so that active functional groups are formed on the surface, leaving it in an activated state. The surface of the second material is placed over the treated surface of the first material so that a chemical bond is formed.

11 Claims, 2 Drawing Figures

4,645,551

METHOD OF MAKING AN OCTOCOUPLER

BACKGROUND OF THE INVENTION

1. Field of the Invention

This invention relates, in general, to a process for bonding the surfaces of two materials and more particularly to a process for bonding the surfaces of the light coupling material and the encapsulating material of an optocoupler to preclude gaps from forming therebetween, thereby inhibiting air and moisture, and therefore electric current, from passing therebetween.

2. Background Art

The number of industrial applications calling for the bonding of the surfaces of two polymeric materials is pervasive One such application is optocouplers used for electrical isolation in systems such as computers, power supplies, telecommunications, and controllers. Optocouplers typically comprise a Light Emitting Diode (LED) electrically connected to one or more electrodes and a light sensing diode electrically connected to one or more additional electrodes. The LED, light sensing diode and portions of the electrodes are enclosed in a light coupling material The light coupling material is then enclosed in an encapsulating material. The light coupling material typically comprises a clear silicone gel that allows light to pass freely from the LED to the light sensing diode, while maintaining electrical isolation between the electrodes. The encapsulating material typically comprises an opaque epoxy that reflects light from the LED back into the clear gel and prevents light from external sources from reaching the clear gel. The encapsulating material also serves as a protective enclosure from external mechanical forces.

However, since the light coupling material and encapsulating material are different in composition and as many as 15,000 volts or more may appear across the electrodes, an electrical breakdown occurs between the electrodes along the boundary surface of the light coupling material and the encapsulating material. The light coupling material and encapsulating material are heated during the manufacturing process and the light coupling material will typically have a coefficient of expansion many times greater than the encapsulating material. During cooling after encapsulation, the light coupling material will therefore contract more than the encapsulating material, causing gaps to form at the interface between the two materials. This gap comprises gas or air and has a lower dielectric strength than the light coupling material and the encapsulating material. Over time, moisture condenses along the electrodes to the boundary between the two materials and into the gaps, thereby substantially increasing the likelihood of electrical breakdown.

One known method of reducing the effect of this electrical leakage path, or separation, is to provide a layer of dielectric strength enhancing material such as glass frit at the boundary between the two materials. The glass particles are placed irregularly and so that each glass particle extends into both materials. However, this method does not improve bonding and does not impede electrical breakdown when a gap forms at the boundary of the two materials. It increases the electrical leakage path length and results in a higher isolation voltage. Air and moisture will fill the gap, providing a path of least resistance for the current. Furthermore, the manufacturing process is substantially complicated by this procedure.

Another known method comprises roughening the surface of the light coupling material thereby increasing the arc length path of current flowing therealong. However, this method increases manufacturing processes and does not increase adhesion of the two materials at their interface.

Yet another known method of reducing electrical breakdown comprises providing an electrically insulating, transparent film on one or more of the electrodes, the LED, and the light sensing diode. However, this procedure does not increase bonding. Manufacturing complexity is increased and air and moisture still can seep between the film and the encapsulating material to the boundary between the light coupling material and the encapsulating material.

Thus, what is needed is a process for adhesively bonding the surfaces of two materials for preventing the materials from separating from each other, preventing air and moisture from seeping along the boundary, and preventing electric current from passing along the boundary interface from one electrode to another electrode.

SUMMARY OF THE INVENTION

Accordingly, it is an object of the present invention to provide an improved process of bonding the surfaces of two materials.

Another object of the present invention is to prevent air and moisture from passing along the boundary of two materials.

A further object of the present invention is to prevent electrical current from passing along the boundary of two materials.

Yet another object of the present invention is to decrease the occurrence of voltage breakdown of optocouplers.

In carrying out the above and other objects of the invention in one form, there is provided a method of bonding the surfaces of a first material and a second material, comprising the steps of treating the surface of the first material such that active functional groups are formed on the surface leaving it in an activated state and placing the surface of the second material over the treated surface of the first material so that a chemical bond is formed.

The above and other objects, features, and advantages of the present invention will be better understood from the following detailed description taken in conjunction with the accompanying drawings.

DETAILED DESCRIPTION OF THE INVENTION

Figure 1:
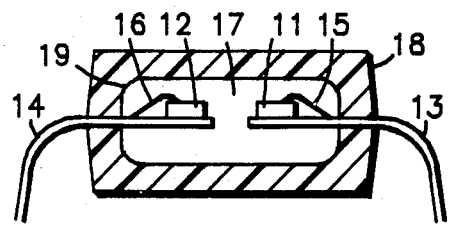
FIG. 1 is a cross section of an optocoupler.

Referring to FIG. 1, an optocoupler is shown that illustrates the advantages of the present invention. Emitter device 11, which typically is a Light Emitting Diode (LED), and detector device 12, which typically is a light sensing diode, are disposed in a predetermined spaced apart relationship on supporting members 13 and 14, respectively. Supporting members 13 and 14 comprise a portion of a conductive lead frame for providing electrical contact to emitter device 11 and detector device 12. A conductive lead frame typically comprises a plurality of conductor elements, wherein electrical contact with each additional conductor element to emitter device 11 and detector device 12 is made through conductors 15 and 16, respectively.

A light coupling material 17 surrounds the emitter device 11 and detector device 12 for enhancing the electrical isolation and permitting transfer of light therebetween. "Light" is intended to include both the spectrum visible to human beings as well as wavelengths to which semiconductor materials are or can be made sensitive. Light coupling material 17 typically comprises a clear polymer, such as a silicone gel, but may alternatively comprise a clear epoxy, glass or other suitable material that enhances electrical isolation and permits transmissivity of light. Encapsulating material 18 surrounds light coupling material 17 which provides mechanical integrity while reflecting light from the emitter device back into the light coupling material and preventing light from ambient sources from reaching the light coupling material 17. Encapsulating material 18 typically comprises an opaque, white reflective epoxy. Interface 19 between light coupling material 17 and encapsulating material 18 is usually the path of lowest dielectric strength between support members 13 and 14. Light coupling material 17 and encapsulating material 18 are heated, i.e. 170 degrees Centigrade, during manufacture. Since light coupling material 17 typically has a higher coefficient of expansion, it will contract more during cooling. Unless strongly bonded, light coupling material 17 has a tendency to separate from encapsulating material 18, leaving gaps, or voids, between their respective surfaces. Over time, air or moisture seeps along the surface of support members 13 and 14 to interface 19 and fills these gaps. When high voltages are placed across support members 13 and 14, current may flow through air and moisture along interface 19, thereby decreasing the isolation resistance and possibly causing a voltage breakdown of the optocoupler. Air and moisture typically have a dielectric strength ten times lower than the light coupling material 17 and encapsulating material 18.

The invention described herein comprises a method for treating the surface of light coupling material 17 after support members 13 and 14, LED 11 and light sensitive diode 12 have been enclosed therein, for increasing the chemical molecular bond at interface 19. A major factor in forming a good adhesive bond between two materials is the interaction of the two surfaces where the bond occurs, i.e., the mutual wettability of the two surfaces with each other as well as the strength of the bonding forces between them. When light coupling material 17 is substantially cured, the outer surface behaves hydrophobically due to methyl ($-CH_3$) groups present on the siloxane backbone. There are very few reactive sites available for reacting with encapsulating material 18, although both are organic in nature such that some wetting occurs. By changing the chemistry of the surface of light coupling material 17, reactive groups can be formed that can combine with reactive groups in the encapsulating material 18. This improves the mutual wettability of both materials as well as forming covalent bonds between them. In other words, the method comprises treating the surface of the first material such that active functional groups are formed on the surface, thereby leaving it in an activated state. Examples of functional groups which may be chemically active with the encapsulating material comprise hydroperoxy groups, hydroxyl groups, peracid groups, formyl groups and carboxylic acid groups. The treatment may be accomplished in one of several ways, including subjecting the light coupling material 17 to ultraviolet (UV) light, flame, chemical reactants, glow or corona discharge or plasma.

The preferred embodiment comprises applying UV light to light coupling material 17. The UV light could be applied in any of several ways and may comprise one or more frequencies. However, UV light produced with a low pressure quartz-mercury vapor lamp which generates UV emissions in the 254 and 185 nanometer range works quite well. The UV light treats the surface by line of sight and must be applied accordingly to cover the entire surface to which bonding is desired. This application generates ozone which diffuses into the surface, reacting and activating the surface for subsequent reactions with the second material. The surface of light coupling material 17 remains in this state for a period of time, typically about 15 minutes and at about 170 degrees Centigrade during which encapsulating material 18 is placed around light coupling material 17. A covalent electrochemical bond is formed at the interface that is so strong, that during cooling and the resultant contraction, the interface will not separate, but stress points will appear in light coupling material 17 instead. The probability of voltage breakdowns due to this event is very low.

Figure 2:
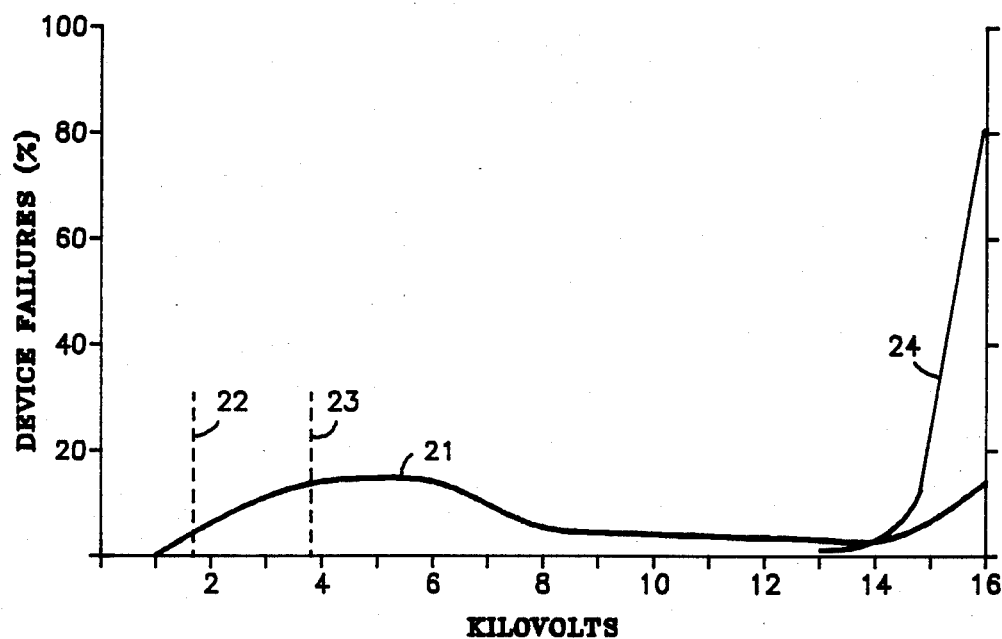
FIG. 2 is a graph illustrating characteristics of the optocoupler incorporating the present invention and characteristics of previously known optocouplers.

FIG. 2 illustrates the percent of optocouplers having voltage breakdown versus voltage applied across support members 13 and 14. Line 21 represents typically the plot of previously known optocouplers. The United States standard, Underwriters Laboratories (UL), or 1,600 volts, below which no voltage breakdowns are acceptable, is represented by line 22. The European standard, Verein Deutscher Elektrotechniker (VDE), or 3,700 volts, is represented by line 23. It may be seen that previously known optocouplers had a majority of breakdowns occurring between 1,000 volts and 8,000 volts. Several breakdowns occurred below the European standard. The plot of breakdowns for the present invention is illustrated by line 24. The majority of breakdowns occur above 14,000 volts. Curves 21 and 24 would be expected to shift to the left when the optocouplers are exposed to heat and humidity over a period of time. However line 24 should not shift to the left below 12,000 volts.

The additional embodiments discussed below all perform in a similar manner in that ozone is produced which diffuses into the first material, reacting with the surface and thereby activating this surface through oxidation and radical formation. A second embodiment comprises subjecting light coupling material 17 to a plasma. A chamber is evacuated to about $10^{-4}$ Torr. or lower to remove air and contaminants. Oxygen gas is bled into the chamber while a voltage is applied across two electrodes to create an oxygen plasma. The light coupling material must typically remain in the plasma for approximately seven minutes.

A third embodiment comprises subjecting light coupling material 17 to a glow discharge. A glow discharge is typically created by placing a voltage of about 10,000 to 20,000 volts, depending on the design of the dielectric electrodes and the airgap therebetween, across two dielectric electrodes separated by ambient air. Ozone is created therebetween which attacks the surface of light coupling material 17 when placed between the electrodes.

A fourth embodiment comprises applying a flame to the surface of light coupling material 17. The flame, i.e., hydrogen or propane, must have enough energy to activate the surface of the heated material and should be applied for only milliseconds.

A fifth embodiment comprises submerging light coupling material 17 in a chemical reactant, i.e. liquid sodium, for a period of time depending on the chemical reactant used.

All of the above disclosed embodiments create a voltage breakdown curve similar to line 24 of FIG. 2.

By now it should be appreciated that there has been provided a process for bonding the surfaces of two polymeric materials and an improved optocoupler manufactured therewith. The bond created inhibits the materials from separating, thereby preventing air, moisture, and electrical current from passing therebetween. Optocouplers manufactured with this process exhibit a substantially higher voltage breakdown.

We claim:

1. A method of making an improved optocoupler having a first conductive support member, a second conductive support member in a predetermined spaced apart relationship, an emitter device attached to a first portion of the first conductive support member, a detector device attached to a first portion of the second conductive support member, a coupling material encasing the emitter device, the detector device, and the first portion of the first and second conductive support member, the coupling material being electrically non-conductive and radiation conductive, and an encapsulating material encasing the coupling material, comprising the step of treating the surface of the coupling material so that active functional groups are formed on the surface which can subsequently react with the functionality present in the encapsulating material thereby forming a bond between the coupling material and the encapsulating material.

2. A method of making an optocoupler having a first support member and a second support member in a predetermined spaced apart relationship, an emitter device attached to a first portion of the first support member, and a detector device attached to a first portion of the second support member, comprising the steps of:

encasing the emitter device, the detector device, and the first portions of the first and second support members within a coupling material which is electrically non-conductive and transparent to radiation in both the visible and non-visible spectrum;

treating the outer surface of the coupling material so that active functional groups are formed on the surface leaving it in an activated state; and encasing the coupling material within an encapsulating material which is opaque so that the treated outer surface of the coupling material forms a bond with the encapsulating material.

3. The method according to claim 2 wherein the treating step comprises the step of subjecting the surface of the coupling material to ozone.

4. The method according to claim 2 wherein the treating step comprises the step of subjecting the surface of the coupling material to ultraviolet light.

5. The method according to claim 2 wherein the treating step comprises subjecting the surface of the coupling material to a plasma.

6. The method according to claim 2 wherein the treating step comprises subjecting the surface of the coupling material to a glow discharge.

7. The method according to claim 2 wherein the treating step comprises subjecting the surface of the coupling material to a corona discharge.

8. The method according to claim 2 wherein the treating step comprises subjecting the surface of the coupling material to a flame.

9. The method according to claim 2 wherein the coupling material comprises a polymer.

10. The method according to claim 2 wherein the coupling material comprises a silicone gel.

11. The method according to claim 2 wherein the encapsulating material comprises an epoxy.

* * * * *

UNITED STATES PATENT AND TRADEMARK OFFICE
CERTIFICATE OF CORRECTION

PATENT NO. : 4,645,551

DATED : Feb. 24, 1987

INVENTOR(S) : Victor J. Adams et al

It is certified that error appears in the above-identified patent and that said Letters Patent is hereby corrected as shown below:

Title: Delete "Octocoupler" and insert therefore -- Optocoupler--.

Signed and Sealed this

Twenty-first Day of February, 1989

Attest:

DONALD J. QUIGG

*Attesting Officer*  *Commissioner of Patents and Trademarks*